(12) United States Patent
Kitabayashi et al.

(10) Patent No.: US 7,209,339 B2
(45) Date of Patent: Apr. 24, 2007

(54) ELECTROSTATIC CHUCK FOR AN ELECTRICALLY INSULATIVE SUBSTRATE, AND A METHOD OF USING SAME

(75) Inventors: Tetsuo Kitabayashi, Fukuoka (JP); Hiroaki Hori, Fukuoka (JP); Takeshi Uchimura, Fukuoka (JP); Noriaki Tateno, Fukuoka (JP); Koh Fuwa, Kanagawa (JP); Ken Maehara, Kanagawa (JP)

(73) Assignees: Ulvac, Inc., Kanagawa (JP); Toto Ltd., Fukuoka (JP)

( * ) Notice: Subject to any disclaimer, the term of this patent is extended or adjusted under 35 U.S.C. 154(b) by 141 days.

(21) Appl. No.: 10/857,068

(22) Filed: May 28, 2004

(65) Prior Publication Data

US 2004/0218340 A1 Nov. 4, 2004

Related U.S. Application Data

(63) Continuation of application No. 09/979,627, filed as application No. PCT/JP00/03355 on May 25, 2000, now Pat. No. 6,768,627.

(30) Foreign Application Priority Data

May 25, 1999 (JP) ................... 11-145507

(51) Int. Cl.
*H01H 1/00* (2006.01)
(52) U.S. Cl. ....................................... 361/234
(58) Field of Classification Search ................. 361/234
See application file for complete search history.

(56) References Cited

U.S. PATENT DOCUMENTS

| | | | |
|---|---|---|---|
| 5,384,681 A * | 1/1995 | Kitabayashi et al. ........ | 361/234 |
| 5,522,131 A * | 6/1996 | Steger ........................ | 29/829 |
| 5,607,541 A * | 3/1997 | Kubota et al. .............. | 156/538 |
| 5,684,669 A * | 11/1997 | Collins et al. .............. | 361/234 |
| 5,701,228 A * | 12/1997 | Ishii ........................... | 361/234 |
| 5,838,529 A | 11/1998 | Shufflebotham et al. | |
| 5,847,918 A * | 12/1998 | Shufflebotham et al. .... | 361/234 |
| 5,886,863 A * | 3/1999 | Nagasaki et al. ........... | 361/234 |
| 5,958,813 A * | 9/1999 | Aida et al. .................. | 501/98.4 |
| 6,028,762 A * | 2/2000 | Kamitani .................... | 361/234 |
| 6,108,190 A * | 8/2000 | Nagasaki .................... | 361/234 |

FOREIGN PATENT DOCUMENTS

| | | |
|---|---|---|
| JP | 05-063062 | 3/1993 |
| JP | 10223742 | 8/1998 |
| JP | 10-242256 | * 11/1998 |
| JP | 11-100271 | * 4/1999 |
| JP | 2000-502509 | 2/2000 |

* cited by examiner

*Primary Examiner*—Stephen W. Jackson
*Assistant Examiner*—Boris Benenson
(74) *Attorney, Agent, or Firm*—Carrier, Blackman & Associates, P.C.; Joseph P. Carrier; William D. Blackman

(57) ABSTRACT

An electrostatic chuck for attracting an insulative substrate to be processed, the electrostatic chuck comprising a dielectric layer having a first surface which attracts an insulative substrate, and a second surface on which are provided a plurality of electrodes, and an insulative support base plate fixing said dielectric layer. A distance between adjacent ones of the electrodes and the thickness of the dielectric layer are adjusted such that when a potential difference is established between the electrodes, a non-uniform electric field is formed in which the insulative substrate is partially polarized and attracted to the first surface by gradient force.

19 Claims, 5 Drawing Sheets

ELECTROSTATIC CHUCK FOR AN ELECTRICALLY INSULATIVE SUBSTRATE, AND A METHOD OF USING SAME

CROSS-REFERENCE TO RELATED APPLICATION

The present application claims priority under 35 USC 120 from application Ser. No. 09/979,627, filed 11 Feb. 2002, the disclosure of which is incorporated herein by reference.

BACKGROUND OF THE INVENTION

1. Field of the Invention

The present invention relates to a processing apparatus of an insulative substrate for use in a PDP (plasma display) manufacturing apparatus, a master writer manufacturing apparatus for a DVD (digital video (or versatile) disc), a substrate processing apparatus for a hard disc manufacturing apparatus, a reticle fixing apparatus in an EB (electron beam) exposure apparatus, and a CVD, etching or sputtering apparatus for manufacturing elements to be formed on SOS (silicon on sapphire) and SOI (silicon on insulator) wafers.

2. Description of Prior Art

In the manufacturing apparatuses for such as a DVD, a PDP or the like, a material to be processed is a glass substrate which shows an electrically insulative characteristic. Therefore, in the conventional art, since it is impossible to electrostatically attract these substrates within a vacuum, they are flatly placed on a stage in the manufacturing apparatus thereof or they are fixed with a mechanical mechanism.

A reticle of the EB exposure apparatus is comprised of quartz which also shows electrically insulative characteristics. Therefore, conventionally, the reticle is fixed under a vacuum with a mechanical mechanism.

SOS wafers and SOI wafers, attracting attention as next-generation alternatives to silicon wafers, show an electrically insulative characteristic with regards to the surface by which they are mounted on a stage. Therefore, conventionally, it is impossible to apply a fixing method using an electrostatic chuck in the manufacturing apparatus for forming devices on these wafers. A means and a principle of electrostatically attracting a silicon wafer are disclosed, for example, in Japanese Patent Application Laid-Open No. Hei 5-63062 (1993), however it is impossible to electrostatically attract an insulative substrate in accordance with the principle.

Also, there is known an apparatus for electrostatically attracting a paper, for example, an electrostatic plotter.

As the level and integration is advanced in the process for forming devices or the like on a substrate for use in a DVD, PDP, or a hard disc, or on an SOS or SOI, the temperature control in the process comes to be very important. With regards to the conventional process for forming devices on a silicon wafer, the temperature control is conducted in the process using an electrostatic chuck.

However, since the electrostatic chuck of the conventional art can attract only a conductor or semiconductor, a material to be processed cannot be electrostatically attracted in a case of having an electrically insulative characteristic. Therefore, it is impossible to control the temperature in the process with high accuracy.

Therefore, an electrostatic chuck, with which an insulative substrate can be electrostatically attracted, and a processing apparatus using such an electrostatic chuck are desired.

For fixing a reticle in the EB exposure apparatus, there is also desired a method using an electrostatic chuck, the structure of which is simpler than that of a mechanical fixation and which has less of a problem of generating dust particles.

SUMMARY OF THE INVENTION

According to the present invention, for solving the problems mentioned above, there is provided an electrostatic chuck which can electrostatically attract an insulative substrate, such as a glass substrate, under a vacuum atmosphere and a heating/cooling apparatus and a temperature controller apparatus for an insulative substrate using such an electrostatic chuck.

In the electrostatic chuck according to the present invention, the distance between a plurality of electrodes which are provided on one side of a dielectric constructing the electrostatic chuck is made small, and the thickness of the dielectric is made thin. A potential difference is given between the electrodes so as to form a non-uniform electric field upon an attracting surface of the dielectric. An insulative material to be processed being within the non-uniform electric field is partially polarized, and generates gradient force that is attracted in the direction being strong in the strength of the electric field. The gradient force is expressed by $F \propto \mathrm{grad}\, E^2$, wherein F is gradient force, $\alpha$ an inductive polarization charge, and E an electric field. The present invention utilizes this effect.

For obtaining the effect mentioned above, according to one aspect of the present invention, there is provided an electrostatic chuck for attracting an insulative substrate to be processed, the electrostatic chuck comprising a dielectric layer having a first surface which attracts an insulative substrate, and a second surface on which are provided a plurality of electrodes, and an insulative support base plate fixing said dielectric layer. A distance between adjacent ones of the electrodes and the thickness of the dielectric layer are adjusted such that when a potential difference is established between the electrodes, a non-uniform electric field is formed in which the insulative substrate is partially polarized and attracted to the first surface by gradient force.

According to another aspect of the present invention, there is provided a heating/cooling apparatus, comprising the electrostatic chuck mentioned above, a plate supporting the electrostatic chuck, in which a flow passage for a medium is formed, and a connector portion between the electrostatic chuck and the plate.

According to a further aspect of the present invention, there is provided a method for electrostatically attracting an insulative substrate using an electrostatic chuck, comprising the steps of: providing an electrostatic chuck including a dielectric layer having a first surface which attracts an insulative substrate and a second surface on which are provided a plurality of electrodes, an insulative support base plate supporting said dielectric layer, and a plurality of electrically conductive terminals which are provided on said insulative support base plate; adjusting a distance between adjacent electrodes and a thickness of the dielectric layer such that when a potential difference is established between the electrodes a non-uniform electric field is formed which partially polarizes the insulative substrate such that the insulative substrate is attracted to the first surface of the dielectric layer by gradient force; wherein the distance between the adjacent electrodes is adjusted to be less than or equal to 2 mm, the thickness of the dielectric layer is adjusted to be less than or equal to 2 mm, and the potential difference is established by connecting the electrically conductive terminals to a high voltage source.

For a more complete understanding of the present invention, the reader is referred to the following detailed description section, which should be read in conjunction with the accompanying drawings. Throughout the following detailed description and in the drawings, like numbers refer to like parts.

DETAILED DESCRIPTION OF PRESENT EMBODIMENTS

Figure 1:
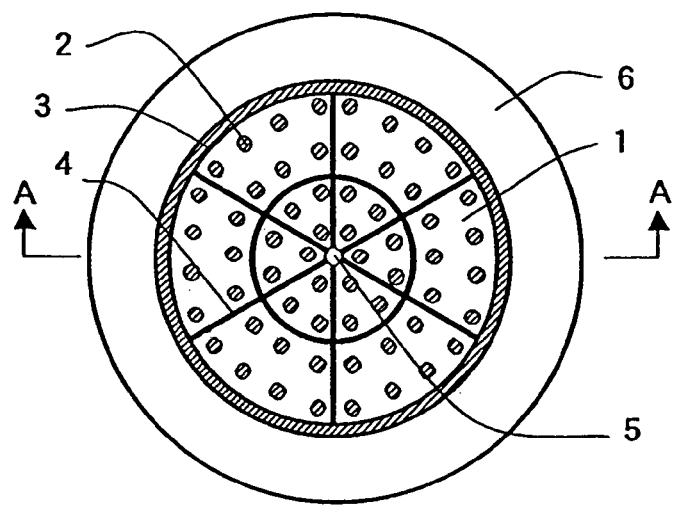
FIG. 1 is a plan view showing an embodiment of an electrostatic chuck according to the present invention.

Hereinafter, embodiments according to the present invention will be fully explained with reference to the attached drawings. FIG. 1 is a plan view showing an embodiment of an electrostatic chuck according to the present invention and FIG. 2 is a cross-sectional view thereof.

Figure 2:
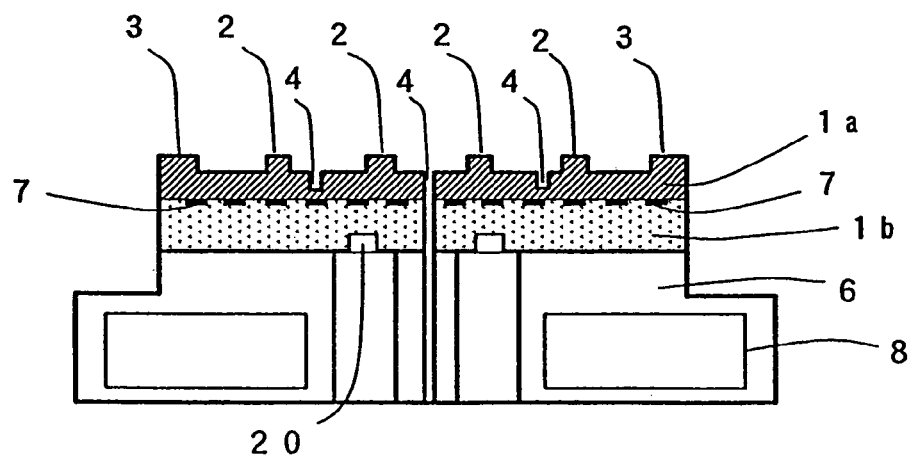
FIG. 2 is a cross-sectional view along with a cutting line A—A in FIG. 1.
Figure 3:
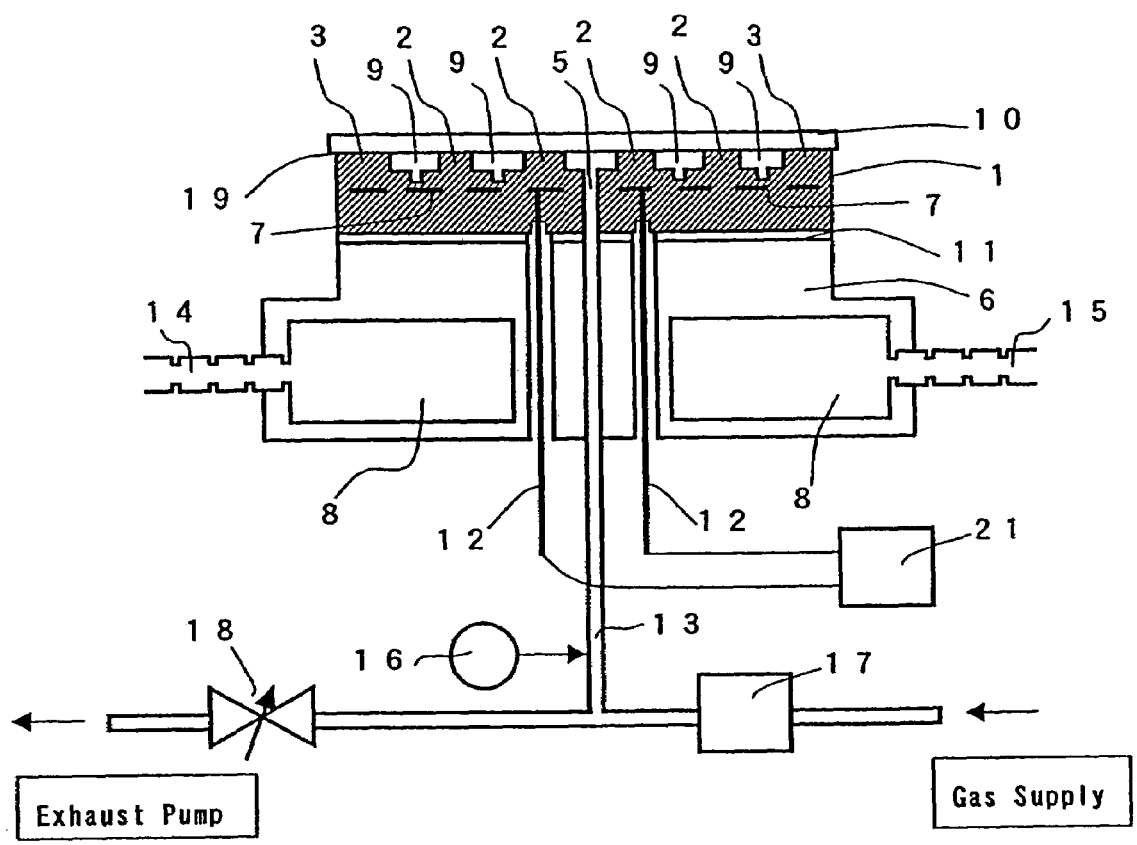
FIG. 3 is a cross-sectional view of another embodiment in which an insulative substrate is attracted by an electrostatic chuck.

In an embodiment shown in FIG. 2, a dielectric layer 1a and an insulative support base plate 1b are comprised of the same material, and integrally formed with a layer-laminated structure. FIG. 3 is a cross-sectional view showing the condition of attracting an insulative substrate 10 by an electrostatic chuck 1. By applying voltage to electrodes 7 through conductors 12 for applying voltage, an attracting force is generated between the insulative substrate 10 and the electrostatic chuck 1, thereby attracting the insulative substrate 10 at protrusions 2 and an outer peripheral seal ring 3 (hereinafter, collectively referred to as a "solid-body contact portion"). Also, the electrostatic chuck 1 is connected through a connector portion 11 onto a metal plate 6, and heating/cooling is conducted to the electrostatic chuck 1 by passing a medium through a medium flow passage 8 which is provided within the metal plate 6.

Figure 4:
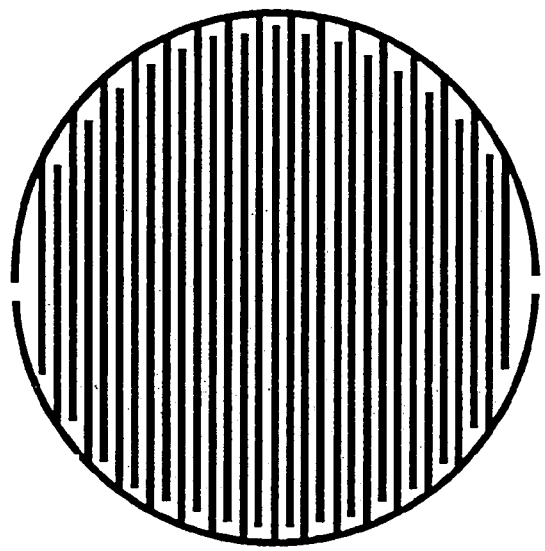
FIG. 4 is a plan view showing an example of a pattern of electrodes provided on a dielectric.
Figure 5:
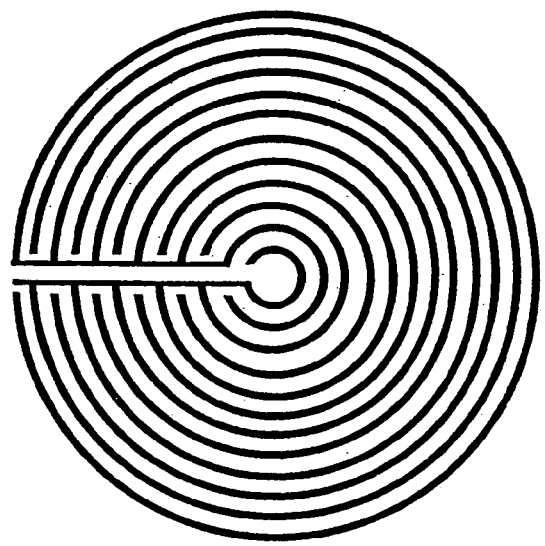
FIG. 5 is a plan view showing another example of a pattern of electrodes provided on a dielectric.
Figure 6:
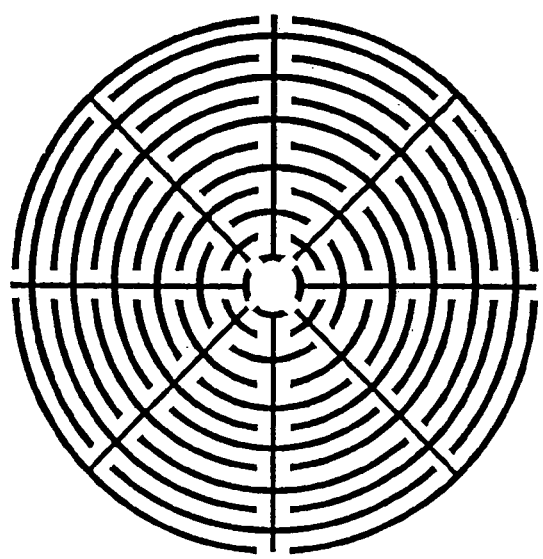
FIG. 6 is a plan view showing another example of a pattern of electrodes provided on a dielectric.

FIGS. 4 through 6 show various examples of a pattern of the electrodes 7 which are formed on one surface of the dielectric layer. By using the electrodes 7 with a plurality of pairs, radio-frequency current which is used in a plasma process for SOS or SOI wafers can be dispersed into each of the electrodes, thereby enabling a load reduction for each of electrically conductive terminals or the like.

Gas is supplied through a gas supply conduit 13 from a gas supply opening 5 and enclosed within a gas enclosure portion 9. In order to quickly and uniformly enclose the gas, grooves 4 are formed on the surface of the electrostatic chuck 1. Through the gas enclosure portion 9 and the solid-body contact portion, heat transmission is conducted between the insulative substrate 10 and the electrostatic chuck 1.

With the provision of a gas pressure gauge 16 in the vicinity of the gas supply conduit, signal voltage is outputted in the range of 0 to 10 V by pressure.

In the gas conduit, a pressure control valve 17 is provided, and opened and closed by comparing the signal voltage of the gas pressure gauge 16 with a preset value, thereby enabling pressure adjustment of the gas to the preset value.

The measurement results of the electrostatically attracting force in a case of changing the properties of the dielectric are shown in Table 1.

TABLE 1

| No. | Scope Of Present Invention | Dielectric Material | Material To Be Attracted | Thickness (μm) | Resistivity Of Dielectric (Ω cm) | Relative Dielectric Constant Of Dielectric | Surface Roughness Of Dielectric Ra (μm) | Electrostatically Attracting Force (g/5 cm$^2$) |
|---|---|---|---|---|---|---|---|---|
| 1A | ○ | Al$_2$O$_3$—Cr$_2$O$_3$—TiO$_2$ Ceramic Sintered Body | Low Alkaline Glass, Substrate Thickness 0.6 mm, Relative Dielectric Constant 5 | 500 | 10$^{10}$ | 9 | 0.25 | >300 |
| 1B | ○ | Al$_2$O$_3$—Cr$_2$O$_3$—TiO$_2$ Ceramic Sintered Body | Low Alkaline Glass, Substrate Thickness 0.6 mm | 500 | 10$^{11}$ | 9 | 0.25 | >300 |
| 1C | ○ | Al$_2$O$_3$—Cr$_2$O$_3$—TiO$_2$ Ceramic Sintered Body | Low Alkaline Glass, Substrate Thickness 0.6 mm | 500 | 10$^{12}$ | 9 | 0.25 | >300 |
| 1D | ○ | Al$_2$O$_3$—Cr$_2$O$_3$—TiO$_2$ Ceramic Sintered Body | Low Alkaline Glass, Substrate Thickness 0.6 mm | 500 | 10$^{13}$ | 9 | 0.25 | >300 |
| 1E | ○ | Al$_2$O$_3$—Cr$_2$O$_3$—TiO$_2$ Ceramic Sintered Body | Low Alkaline Glass, Substrate Thickness 0.6 mm | 1000 | 10$^{11}$ | 9 | 0.25 | >300 |
| 1F | ○ | Al$_2$O$_3$—Cr$_2$O$_3$—TiO$_2$ Ceramic Sintered Body | Low Alkaline Glass, Substrate Thickness 0.6 mm | 500 | 10$^{11}$ | 9 | 0.4 | 250 |
| 1G | ○ | Al$_2$O$_3$—Cr$_2$O$_3$—TiO$_2$ Ceramic Sintered | Low Alkaline Glass, Substrate Thickness | 500 | 10$^{11}$ | 9 | 1.0 | 50 |

TABLE 1-continued

| No. | Scope Of Present Invention | Dielectric Material | Material To Be Attracted | Thickness ($\mu m$) | Resistivity Of Dielectric ($\Omega$ cm) | Relative Dielectric Constant Of Dielectric | Surface Roughness Of Dielectric Ra ($\mu m$) | Electrostatically Attracting Force (g/5 cm$^2$) |
|---|---|---|---|---|---|---|---|---|
| 1H | ○ | $Al_2O_3$—$Cr_2O_3$—$TiO_2$ Ceramic Sintered Body | Quartz Glass, Thickness 5 mm, Relative Dielectric Constant 4 | 500 | $10^{11}$ | 9 | 0.25 | >300 |
| 1I | ○ | $Al_2O_3$—$Cr_2O_3$—$TiO_2$ Ceramic Sintered Body | Sapphire, Thickness 0.5 mm, Relative Dielectric Constant 10 | 500 | $10^{11}$ | 9 | 0.25 | >300 |
| 1J | ○ | $Al_2O_3$—$Cr_2O_3$—$TiO_2$ Ceramic Sintered Body | High Dielectric Substrate (Relative Dielectric Constant 120, Thickness 0.5 mm) | 500 | $10^{11}$ | 9 | 0.25 | >300 |
| 1K | ○ | $Al_2O_3$—$Cr_2O_3$—$TiO_2$ Ceramic Sintered Body | High Dielectric Substrate (Relative Dielectric Constant 10,000, Thickness 0.5 mm) | 500 | $10^{11}$ | 9 | 0.25 | >300 |
| 1L | ○ | $Al_2O_3$—$Cr_2O_3$—$TiO_2$ Ceramic Sintered Body | Polyimide Film (Thickness 50 $\mu m$) | 500 | $10^{11}$ | 9 | 0.25 | 100 |
| 1M | ○ | $Al_2O_3$—$Cr_2O_3$—$TiO_2$ Ceramic Sintered Body | SOI Wafer | 500 | $10^{11}$ | 9 | 0.25 | >300 |
| 1N | ○ | $Al_2O_3$—$Cr_2O_3$—$TiO_2$ Ceramic Sintered Body | SOS Wafer | 500 | $10^{11}$ | 9 | 0.25 | >300 |
| 1O | ○ | $Al_2O_3$—$Cr_2O_3$—$TiO_2$ Ceramic Sintered Body | Polycrystal Alumina Substrate, Thickness 0.6 mm, Surface Roughness Ra 0.1 $\mu m$, Relative Dielectric Constant 10 | 500 | $10^{11}$ | 9 | 0.25 | >300 |
| 1P | ○ | $Al_2O_3$—$Cr_2O_3$—$TiO_2$ Ceramic Sintered Body | Polycrystal Alumina Substrate, Thickness 0.6 mm, Surface Roughness Ra 0.4 $\mu m$, Relative Dielectric Constant 10 | 500 | $10^{11}$ | 9 | 0.25 | >300 |
| 2 | ○ | $Al_2O_3$ Ceramic Sintered Body | Low Alkaline Glass, Substrate Thickness 0.6 mm | 500 | $10^{15}$ | 9 | 0.1 | 100 |
| 3 | ○ | $BaTiO_3$ Ceramic Sintered Body | Low Alkaline Glass, Substrate Thickness 0.6 mm | 500 | $10^{11}$ | 120 | 0.1 | 150 |
| 4 | ○ | $BaTiO_3$ Ceramic Sintered Body | Low Alkaline Glass, Substrate Thickness 0.6 mm | 500 | $10^{10}$ | 10,000 | 0.2 | 100 |
| 5 | ○ | $BaTiO_3$ Ceramic Sintered Body | Low Alkaline Glass, Substrate Thickness 0.6 mm | 500 | $10^9$ | 20,000 | 0.3 | 100 |
| 6 | ○ | SiC Ceramic Sintered Body | Low Alkaline Glass, Substrate Thickness 0.6 mm | 500 | $10^{10}$ | 120 | 0.1 | >300 |
| 7 | ○ | Silicon Rubber | Low Alkaline Glass, Substrate Thickness 0.6 mm | 500 | $10^{10}$ | 3 | 0.4 | 150 |

In the measurement of the electrostatically attracting force, a material to be attracted having an area of 5 cm$^2$ was prepared, DC voltage in the range of 3 to 10 KV was applied to the electrostatic chuck. When the material to be attracted started moving against the electrostatically attracting force by applying force to the material to be attracted in the horizontal direction, the moving force was measured by a spring scale. Because the maximum load of the spring scale was 300 g, it was impossible to measure force being larger than that. However, if the coefficient of static friction between the dielectric and the material to be attracted is 0.2, the electrostatically attracting force will correspond to reaction about five (5) times as large as the measured value. Therefore, the electrostatically attracting force will correspond to the tensile strength of 300 g/cm$^2$ in the case where the measured value is 300 g/5 cm$^2$. This value corresponds to about 30 kPa, which is enough to attract the material to be attracted within a vacuum chamber. In order to make the shape of the dielectric uniform, it was set to be 1 mm in the width of the electrode, 1 mm in the distance between the electrodes, and 0.5 mm in the thickness of the dielectric.

1A through 1D and 2 show the electrostatically attracting force in a case of varying the resistivity of the dielectric substrate. The resistivity does not have an influence on the electrostatic force very much; however, it is preferable that the resistivity be less than or equal to $10^{13}$ Ω cm, which creates larger electrostatically attracting force.

1F and 1G show the electrostatically attracting force in a case of varying the surface roughness of the dielectric substrate. Compared to 1B, it is preferable that the surface roughness be less than or equal to Ra 0.25 μm.

The surface roughness of the material to be attracted used in the present embodiment is less than or equal to Ra 0.1 μm, except for the substrate of polycrystal alumina in 1P.

1B and 2 through 6 show the electrostatically attracting force in a case of varying the dielectric material. As the properties of the dielectric, the resistivity rather than the relative dielectric constant has a larger relationship to the electrostatically attracting force. With regards to the dielectric material, the most stable and large attracting force can be achieved by using a ceramic sintered body obtained by adding chromium oxide and/or titanium oxide to alumina, and the material obtained by adding a sinter assisting material thereto.

1B and 1H through 1N show the electrostatically attracting force in a case of varying the kind of the material to be attracted. The result shows that different insulative materials can be electrostatically attracted, and that the larger the relative dielectric constant of the material to be attracted, the larger the force.

In 1O and 1P, a substrate of polycrystal alumina is used as a material to be attracted, the surface roughness thereof is varied, and then the electrostatically attracting force is measured. The result shows that the sufficient force can be obtained if the surface roughness of the material to be attracted is around Ra 0.4 μm Therefore, when the relative dielectric constant of the material to be attracted becomes large, the surface roughness of the material to be attracted can be degraded.

Nos. 2 through 7 show the electrostatically attracting force in a case of varying the dielectric material. The result shows that the sufficient force can be obtained if a material other than a ceramic sintered body obtained by adding chromium oxide and/or titanium oxide to alumina is used. In a case of glass for a PDP as a material to be attracted, it is preferable to use a material of rubber group. Such a material is hard to damage the glass and is effective from the viewpoint of visibility. In the present embodiment, silicon rubber is used; however, natural rubber, chloroprene rubber, butyl rubber, nitrile rubber, fluorocarbon rubber, or resin such as polyurethane, PTFE, or the like, may be used. In this instance, it is preferable that the volume resistivity thereof be less than or equal to $10^{13}$ Ω cm.

Table 2 shows the relationship between the electrostatically attracting force with respect to a glass substrate and the applied voltage (10 kV) in a case of using ceramic sintered body obtained by adding chromium oxide and/or titanium oxide to alumina, and varying the pattern of the electrodes in the electrostatic chuck according to the present invention.

TABLE 2

| No. | Scope Of Present Invention | Thickness of Dielectric (μm) | Width of Electrodes (mm) | Distance Between Electrodes (mm) | Electrostatically Attracting Force (g/5 cm$^2$) 10 KV |
|---|---|---|---|---|---|
| 7  | X | 300 | 0.3 | 0.3 | Break down |
| 8  | ◯ | 300 | 0.5 | 0.5 | Break down |
| 9  | ◯ | 300 | 0.7 | 0.7 | >300 |
| 10 | ◯ | 300 | 1.0 | 1.0 | >300 |
| 11 | ◯ | 300 | 2.0 | 2.0 | 180 |
| 12 | X | 300 | 3.0 | 3.0 | 30 |
| 13 | ◯ | 300 | 0.5 | 1.0 | >300 |
| 14 | ◯ | 300 | 0.5 | 1.5 | 200 |
| 15 | ◯ | 300 | 2.0 | 1.0 | 250 |
| 16 | ◯ | 300 | 4.0 | 1.0 | 120 |
| 17 | X | 300 | 6.0 | 1.0 | 30 |
| 18 | X | 400 | 0.3 | 0.3 | Break down |
| 19 | ◯ | 400 | 0.5 | 0.5 | >300 |
| 20 | ◯ | 400 | 0.7 | 0.7 | >300 |
| 21 | ◯ | 400 | 1.0 | 1.0 | >300 |
| 22 | ◯ | 400 | 2.0 | 2.0 | 120 |
| 23 | X | 400 | 3.0 | 3.0 | 30 |
| 24 | ◯ | 400 | 0.5 | 1.0 | >300 |
| 25 | ◯ | 400 | 0.5 | 1.5 | 200 |
| 26 | ◯ | 400 | 2.0 | 1.0 | 200 |
| 27 | ◯ | 400 | 4.0 | 1.0 | 100 |
| 28 | X | 400 | 6.0 | 1.0 | 20 |
| 29 | X | 500 | 0.3 | 0.3 | Break down |
| 30 | ◯ | 500 | 0.5 | 0.5 | Break down |
| 31 | ◯ | 500 | 0.7 | 0.7 | >300 |
| 32 | ◯ | 500 | 1.0 | 1.0 | 280 |
| 33 | ◯ | 500 | 2.0 | 2.0 | 100 |
| 34 | X | 500 | 3.0 | 3.0 | 20 |
| 35 | ◯ | 500 | 0.5 | 1.0 | >300 |
| 36 | ◯ | 500 | 0.5 | 1.5 | 200 |
| 37 | ◯ | 500 | 2.0 | 1.0 | 165 |
| 38 | ◯ | 500 | 4.0 | 1.0 | 45 |
| 39 | X | 500 | 6.0 | 1.0 | 25 |
| 40 | X | 700 | 0.3 | 0.3 | Break down |
| 41 | ◯ | 700 | 0.5 | 0.5 | 240 |
| 42 | ◯ | 700 | 0.7 | 0.7 | 240 |
| 43 | ◯ | 700 | 1.0 | 1.0 | 220 |
| 44 | ◯ | 700 | 2.0 | 2.0 | 90 |
| 45 | X | 700 | 3.0 | 3.0 | 20 |
| 46 | ◯ | 700 | 0.5 | 1.0 | 260 |
| 47 | ◯ | 700 | 0.5 | 1.5 | 150 |

TABLE 2-continued

| No. | Scope Of Present Invention | Thickness of Dielectric (μm) | Width of Electrodes (mm) | Distance Between Electrodes (mm) | Electrostatically Attracting Force (g/5 cm$^2$) 10 KV |
|---|---|---|---|---|---|
| 48 | ○ | 700 | 2.0 | 1.0 | 140 |
| 49 | ○ | 700 | 4.0 | 1.0 | 50 |
| 50 | X | 700 | 6.0 | 1.0 | 20 |
| 51 | X | 1,000 | 0.3 | 0.3 | Break down |
| 52 | ○ | 1,000 | 0.5 | 0.5 | 200 |
| 53 | ○ | 1,000 | 0.7 | 0.7 | 200 |
| 54 | ○ | 1,000 | 1.0 | 1.0 | 180 |
| 55 | ○ | 1,000 | 2.0 | 2.0 | 70 |
| 56 | X | 1,000 | 3.0 | 3.0 | 20 |
| 57 | ○ | 1,000 | 0.5 | 1.0 | 220 |
| 58 | ○ | 1,000 | 0.5 | 1.5 | 120 |
| 59 | ○ | 1,000 | 2.0 | 1.0 | 120 |
| 60 | ○ | 1,000 | 4.0 | 1.0 | 30 |
| 61 | X | 1,000 | 6.0 | 1.0 | 10 |
| 62 | X | 2,000 | 0.3 | 0.3 | Break down |
| 63 | ○ | 2,000 | 0.5 | 0.5 | 170 |
| 64 | ○ | 2,000 | 0.7 | 0.7 | 130 |
| 65 | ○ | 2,000 | 1.0 | 1.0 | 100 |
| 66 | ○ | 2,000 | 2.0 | 2.0 | 10 |
| 67 | X | 2,000 | 3.0 | 3.0 | 10 |
| 68 | ○ | 2,000 | 0.5 | 1.0 | 120 |
| 69 | ○ | 2,000 | 0.5 | 1.5 | 30 |
| 70 | ○ | 2,000 | 2.0 | 1.0 | 70 |
| 71 | ○ | 2,000 | 4.0 | 1.0 | 30 |
| 72 | X | 2,000 | 6.0 | 1.0 | 10 |

In a case of the pattern having the same width of the electrode and the same distance between the electrodes, the maximum electrostatically attracting force can be obtained when the thickness of the dielectric is 0.3 mm, and there is a tendency that the thinner the thickness thereof, the larger the electrostatically attracting force.

If both of the width and the distance are equal to or greater than 0.5 mm, the electrostatically attracting is available. However sufficient insulation between the electrodes cannot be achieved if the distance between the electrodes is smaller than 0.5 mm. As a result of this, there are cases where the electrostatically attracting cannot be obtained.

In a case of comparing the dielectric having the same thickness, the smaller the width of the electrode, the larger the electrostatically attracting force.

In a case where the distance between the electrodes is larger than 2 mm, the electrostatically attracting force can hardly be obtained. In the present embodiment, the voltage applied is raised to 10 kV. It is expected that the sufficient force can be obtained even if the distance between the electrodes is 2 mm, by applying voltage being larger than that.

In a case of comparing the dielectric having the same thickness and the same width of the electrode, there is a tendency that the electrostatically attracting force becomes small when the distance between the electrodes is larger than the thickness of the dielectric.

The foregoing show that a large electrostatically attracting force can be obtained in a case where the thickness of the dielectric is thin, the width of the electrode is small, and the distance between the electrodes is almost equal to the width of the electrode.

In a case of electrostatically attracting a glass substrate as a material to be attracted, it can be put to practical use by setting the thickness of the dielectric in the range of 0.3 to 2.0 mm, the distance between the electrodes in the range of 0.5 to 1.0 mm, the width of the electrodes in the range of 0.5 to 4.0 mm, and the resistivity of the dielectric to be less than or equal to $10^{13}$ Ω cm. It is more preferable that the thickness of the dielectric be in the range of 0.3 to 1.0 mm, the distance between the electrodes in the range of 0.5 to 1.0 mm, the width of the electrodes in the range of 0.5 to 1.0 mm, and the resistivity of the dielectric to be less than or equal to $10^{13}$ Ω cm.

Hereinafter, an embodiment of a substrate heating/cooling apparatus will be described.

Figure 7:
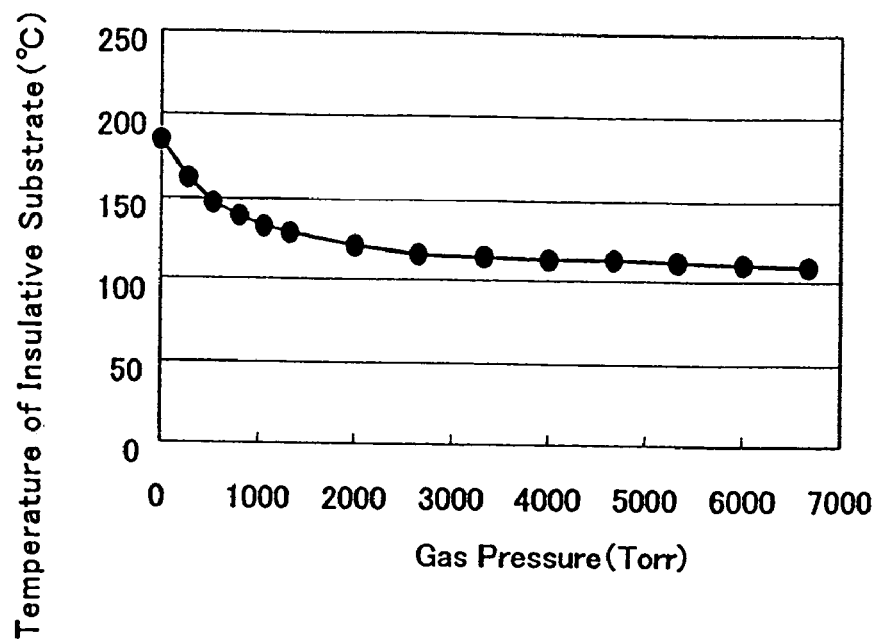
FIG. 7 is a graph showing the relationship between the heating/cooling gas pressure and the temperature of an insulative substrate.
Figure 8:
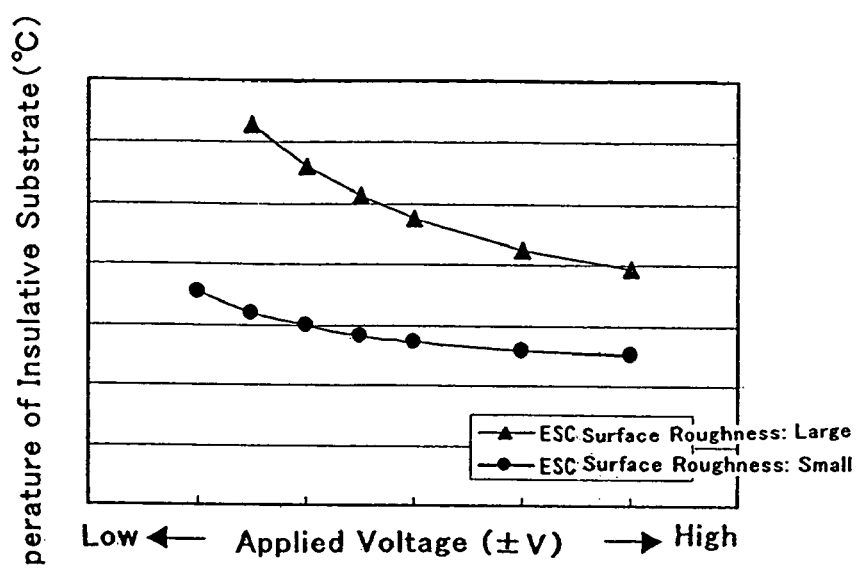
FIG. 8 is a graph showing the relationship between the voltage applied to an electrostatic chuck and the temperature of an insulative substrate.
Figure 9:
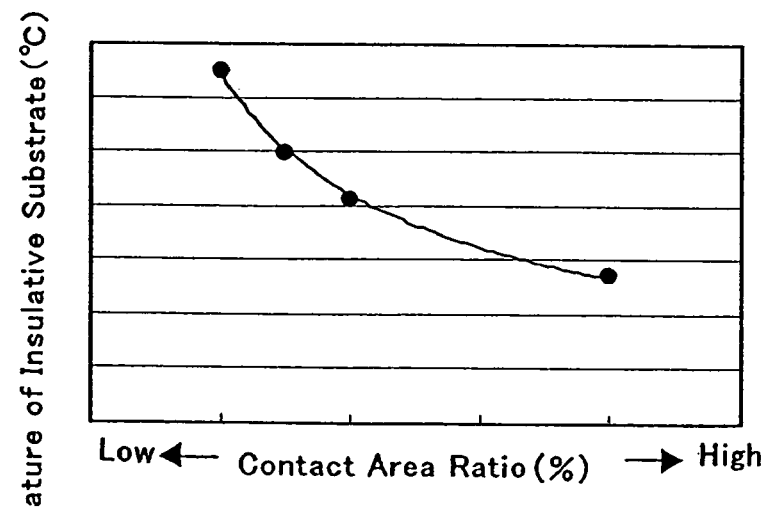
FIG. 9 is a graph showing the relationship between the area ratio of a solid-body contact portion to an electrostatic chuck and the temperature of an insulative substrate.

FIGS. 7 through 9 are graphs showing data on thermal attraction experiments and cooling experiments on an insulative substrate. A glass substrate (i.e., a low alkaline glass) is used as the insulative substrate 10.

FIG. 7 is a graph showing the relationship between the temperature of an insulative substrate and the pressure of the gas for heating/cooling to be supplied into a space between the insulative substrate and the attracting surface of the dielectric, in which the insulative substrate is positioned in a substrate heating/cooling apparatus which is provided within a vacuum chamber. The thermal characteristic in a case where a heat flow of 2 W/cm$^2$ is supplied from the upper surface of the insulative substrate 10 is shown by expressing the pressure of the above-mentioned gas on x-axis and the surface temperature of the insulative substrate 10 on y-axis. This graph shows that the temperature of the insulative substrate 10 can be controlled by varying the gas pressure enclosed in a gas enclosure portion 9. He gas is mainly used in the present experiment; however, the same heating/cooling effect can be obtained by using Ar or N$_2$.

In order to increase efficiency of the heating/cooling by supplying higher pressure, it is necessary to make the height of the protrusions 2 on the attracting surface of the dielectric 19 low and thereby bring the pressure of the gas into the region of a molecular flow. For example, in order to bring the above-mentioned gas in the range of 0 to 13329 Pa (0 to 100 Torr) into the region of a molecular flow, the height of the protrusions 2 may be set to be less than or equal to 5 μm. In this instance, in order to quickly and uniformly enclose the above-mentioned gas, the formation of the grooves 4 is important as well as the protrusions 2.

In a case where only the protrusions are formed on the surface of the electrostatic chuck, it takes time until the pressure within the space comes to be uniform depending upon the height of the protrusions. Therefore, by forming of the grooves from the gas supply opening, the time is reduced until the pressure within the space comes to be uniform. With regards to the shape and the pattern of the grooves, the effect can be achieved when they are formed in a radial pattern from the gas supply opening, and they are equal to or greater than 1.0 mm in the width and equal to or greater than 50 μm in the depth. Preferably, the width is equal to or greater than 1.5 mm and the depth is equal to or greater than 250 μm, and thereby the time until the pressure distribution in the shape comes to be uniform is less than or equal to 5 seconds. The effect can be further increased if the grooves are formed in a concentric pattern as well as a radial pattern.

As shown in FIG. 8, by varying the applied voltage, it is possible to vary the temperature of the insulative substrate 10. In this instance, by varying the surface roughness of the electrostatic chuck, it is possible to adjust the temperature of the insulative substrate 10.

Further, as shown in FIG. 9, the experiment result shows that the temperature of the insulative substrate 10 is varied by varying the ratio of a contact area. In order to vary the contact area ratio, it is necessary to vary the number and the diameter of the protrusions. The diameter of the protrusions in the present embodiment is 5 mm, and the width of the seal ring is 4 mm. The number of the protrusions is converted from the contact area ratio. The protrusions are distributed upon the surface of the electrostatic chuck in the substantially equal position with regards to each other.

The present embodiment shows that large heating/cooling effect on the insulative substrate 10 can be obtained by enclosing the high gas pressure of 6664 Pa (50 Torr) in the gas enclosure portion 9. However, in order to enclose such high gas pressure, it is necessary that the electrostatic chuck generate a large attracting force. For example, in order to enclose the gas pressure of 1333 Pa (10 Torr) in a case where the contact area ratio is 20%, theoretically, the attracting force of at least 13 g/cm$^2$ is required. Therefore, the electrostatic chuck having a very large attracting force is required. As a material for an insulating layer of the electrostatic chuck is used a ceramic sintered body comprised of mainly alumina, and chromium oxide ($Cr_2O_3$), titanium oxide ($TiO_2$), and a sinter assisting material added thereto in an appropriate amount. The attracting force in this material is about 300 g/5 cm$^2$ under application of 10 KV, which is the same as 1A–1C mentioned above, and the tensile strength in the vertical direction can be assumed to be 300 g/cm$^2$. Even if the contact area ratio is 20%, it can be ensured that the attracting force is equal to or greater than 60 g/cm$^2$. Therefore, it is possible to sufficiently attract the insulative substrate.

A low alkaline glass is used as the insulative substrate 10 in the present embodiment; however, the electrostatic chuck according to the present invention can in general also be applied to other electrical insulative substrates and/or films.

With the provision of a heater within the insulative support base plate of the heating/cooling apparatus for an insulative substrate, and an optical thermometer, a thermocouple, or another noncontact thermometer as a means for measuring the temperature on the material to be attracted, the signal outputted from the measurement apparatus is compared with a predetermined value, and thereby the temperature of the material to be attracted can easily be controlled. In a case where the temperature of the insulative substrate cannot directly be measured, it is possible to maintain the temperature of the insulative substrate based on a data base in which the gas pressure, the applied voltage, the ratio of the solid-body contact area, the supplied thermal energy, the flow rate of the medium, the temperature of the medium, or the like are compiled in advance and linked together.

With the provision of the heating/cooling apparatus for an insulative substrate according to the present embodiment within a reaction chamber, it is possible to easily control the temperature in a semiconductor manufacturing process, in particular, in a plasma CVD for an SOS or SOI, a plasma etching, a sputtering, or the like.

As is fully explained in the above, according to the present invention, since a material to be processed can be attracted with the electrostatic chuck even if it is an insulative material, it is possible to easily heat/cool the insulative substrate with the heating/cooling apparatus in which the electrostatic chuck is installed, and thereby it is possible to control the temperature of the insulative substrate at a predetermined value.

Although there have been described what are the present embodiments of the invention, it will be understood to persons skilled in the art that variations and modifications may be made thereto without departing from the gist, spirit and essence of the invention. The scope of the invention is indicated by the appended claims.

What is claimed is:

1. An electrostatic chuck for attracting an insulative substrate to be processed, the electrostatic chuck comprising:
    a dielectric layer having a first surface which attracts an insulative substrate, and a second surface on which a plurality of electrodes are intricately provided to be alternatingly adjacent;
    wherein the dielectric layer is comprised of a sintered ceramic,
    a distance between the adjacent electrodes and the thickness of the dielectric layer are adjusted such that when a potential difference is established between the electrodes, a non-uniform electric field is formed in which an insulative substrate is attracted to the first surface;
    a distance between the adjacent electrodes is equal to or greater than 0.5 mm and less than or equal to 2 mm,
    a thickness of the dielectric layer is equal to or greater than 0.3 mm and less than or equal to 2 mm, and
    a width of the electrodes is equal to greater than 0.5 mm and less than or equal to 4 mm so as to attract an insulative substrate whose top surface and surface to be mounted on the electrostatic chuck has an electrically insulative characteristic.

2. An electrostatic chuck according to claim 1,
    wherein a potential difference between the electrodes is a DC voltage in the range of 3 to 10 kV.

3. The electrostatic chuck according to claim 1, wherein the resistivity of the dielectric layer is less than or equal to $10^{13}$ Ωcm at room temperature.

4. The electrostatic chuck according to of claim 1, wherein the first surface of the dielectric layer includes grooves, protrusions or an outer peripheral seal ring.

5. The electrostatic chuck according to claim 1, further comprising
    an insulative support base plate and a plurality of electrically conductive terminals provided on said insulative support base plate;
    wherein the insulative substrate is partially polarized and attracted to the first surface of the dielectric layer by a gradient force in the non-uniform electric field; and wherein the electrically conductive terminals are electrically connected to a DC voltage source having a voltage in the range of 3 to 10 kV.

6. The electrostatic chuck according to claim 5, wherein a gas for adjusting a temperature of the substrate is enclosed within a space defined between the first surface of the dielectric layer and the substrate.

7. The electrostatic chuck according to claim 6, wherein the insulative substrate is comprised of glass.

8. The electrostatic chuck according to claim 1, further comprising an insulative support base plate comprised of glass.

9. A method for electrostatically attracting an insulative substrate using an electrostatic chuck, comprising the steps of:
providing an electrostatic chuck including a dielectric layer having a first surface which attracts an insulative substrate and a second surface on which a plurality of electrodes are intricately provided to be alternating adjacent, an insulative support base plate supporting said dielectric layer, and a plurality of electrically conductive terminals which are provided on said insulative support base plate;
adjusting a distance between adjacent ones of the electrodes and a thickness of the dielectric layer such that when a potential difference is established between the electrodes, a non-uniform electric field is formed which partially polarizes an insulative substrate such that the insulative substrate is attracted to the first surface of the dielectric layer;
wherein the dielectric layer is comprised of a sintered ceramic,
a distance between the adjacent electrodes is adjusted to be equal to or greater than 0.5 mm and less than or equal to 2 mm,
a thickness of the dielectric layer is adjusted to be equal to or greater than 0.3 mm and less than or equal to 2 mm, and
a width of electrodes is equal to or greater than 0.5 mm and less than or equal to 4 mm so as to attract an insulative substrate whose top surface and surface to be mounted on the electrostatic chuck has an electrically insulative characteristic.

10. The method for electrostatically attracting an insulative substrate according to claim 9, further including the step of enclosing a gas for heating or cooling the substrate within a space defined between the first surface of the dielectric layer and the substrate, and bringing a pressure of the gas into a region of a molecular flow.

11. The method for electrostatically attracting an insulative substrate according the claim 9, wherein the insulative substrate is comprised of glass.

12. An apparatus for heating, cooling and processing, comprising:
an electrostatic chuck as defined in claim 1;
a plate supporting the electrostatic chuck, in which a flow passage for a medium is formed; and
a connector portion between the electrostatic chuck and the plate.

13. The apparatus for heating, cooling and processing according to claim 12, wherein the insulative substrate is comprised of glass.

14. The method of electrostatically attracting an insulative substrate according to claim 9, wherein the potential between electrodes is a DC voltage in the range of 3 to 10 kV.

15. The electrostatic chuck according to claim 1, wherein the insulative substrate comprises glass.

16. The electrostatic chuck according to claim 1, further comprising
a high-voltage source;
an insulative support base plate supporting said dielectric layer; and
a plurality of electrically conductive terminals which are provided on said insulative support base plate; and wherein
the electrically conductive terminals and the high voltage source are connected using a connector.

17. The electrostatic chuck according to claim 16, wherein the potential between electrodes is a DC voltage in the range of 3 to 10 kV.

18. The electrostatic chuck according claim 16, wherein a gas is enclosed for heating or cooling the substrate within a space defined between the first surface of the dielectric layer and the substrate.

19. The electrostatic chuck according claim 16, wherein the insulative substrate is comprised of glass.

* * * * *

UNITED STATES PATENT AND TRADEMARK OFFICE
CERTIFICATE OF CORRECTION

PATENT NO. : 7,209,339 B2  Page 1 of 1
APPLICATION NO. : 10/857068
DATED : April 24, 2007
INVENTOR(S) : Kitabayashi et al.

It is certified that error appears in the above-identified patent and that said Letters Patent is hereby corrected as shown below:

Title Page:
   Item "(75) Inventors:", change "Ken Maehara" to --Ken Maehira--.
Column 1:
   Line 39, change "with regards to" to --with regard to--.
   Line 46, change "(1993), however it is" to --(1993), however, it is--.
Column 9:
   Line 36, chagne "However sufficient insulation" to --However, sufficient insulation--.
Column 10:
   Line 38, change "(i.e., a low alkaline glass)" to --(i.e., a low-alkaline glass)--.
Column 11:
   Line 31, change "with regards to" to --with regard to--.
Column 12:
   Line 57, change "according to of claim 1," to --according to claim 1,--.
   Line 61, change "comprising" to --comprising:--.
Column 14:
   Line 6, change "according the claim 9," to --according to claim 9,--.
   Line 25, change "comprising" to --comprising:--.

Signed and Sealed this

Seventh Day of August, 2007

JON W. DUDAS
*Director of the United States Patent and Trademark Office*